(12) United States Patent
Li et al.

(10) Patent No.: US 12,354,668 B2
(45) Date of Patent: Jul. 8, 2025

(54) PROGRAMMING METHOD FOR SEMICONDUCTOR DEVICE AND SEMICONDUCTOR DEVICE

(71) Applicant: YANGTZE MEMORY TECHNOLOGIES CO., LTD., Wuhan (CN)

(72) Inventors: Kaiwei Li, Wuhan (CN); Jianquan Jia, Wuhan (CN); Yuanyuan Min, Wuhan (CN); Ying Cui, Wuhan (CN); Yali Song, Wuhan (CN); Hongtao Liu, Wuhan (CN); Xinlei Jia, Wuhan (CN); An Zhang, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 268 days.

(21) Appl. No.: 18/090,444

(22) Filed: Dec. 28, 2022

(65) Prior Publication Data
US 2023/0162798 A1  May 25, 2023

Related U.S. Application Data

(63) Continuation of application No. PCT/CN2021/126181, filed on Oct. 25, 2021.

(30) Foreign Application Priority Data

Jan. 6, 2021 (CN) .......................... 202110010729.7

(51) Int. Cl.
*G11C 16/10* (2006.01)
*G11C 16/08* (2006.01)
*G11C 16/28* (2006.01)

(52) U.S. Cl.
CPC ............ *G11C 16/102* (2013.01); *G11C 16/08* (2013.01); *G11C 16/28* (2013.01)

(58) Field of Classification Search
CPC .................................................... G11C 16/28
See application file for complete search history.

(56) References Cited

U.S. PATENT DOCUMENTS

| 2011/0255336 A1* | 10/2011 | Futatsuyama | ....... | G11C 11/5628 |
| | | | | 365/185.03 |
| 2012/0182809 A1* | 7/2012 | Dutta | .................. | G11C 11/5628 |
| | | | | 365/185.18 |

(Continued)

FOREIGN PATENT DOCUMENTS

| CN | 101627439 A | 1/2010 |
| CN | 110945592 A | 3/2020 |

(Continued)

*Primary Examiner* — Douglas King
(74) *Attorney, Agent, or Firm* — BAYES PLLC

(57) ABSTRACT

A programming method and a semiconductor device are provided. The semiconductor device includes a memory string that includes a plurality of first memory cells and a first dummy cell stacked in sequence, and each first memory cell is connected to a respective word line, and a gate of the first dummy cell is connected to a first dummy word line. The method includes: in a programming phase, applying a first pass voltage to a word line corresponding to a first unprogrammed memory cell, wherein the first unprogrammed memory cell is an unprogrammed memory cell of the plurality of first memory cells separated from a to-be-programmed memory cell by a first preset number of first memory cells; and after applying the first pass voltage to the word line corresponding to the first unprogrammed memory cell, applying a programming voltage to the word line corresponding to the to-be-programmed memory cell.

20 Claims, 4 Drawing Sheets

(56) References Cited

U.S. PATENT DOCUMENTS

2017/0084341 A1\* 3/2017 Lee .................. G11C 16/08
2018/0005696 A1\* 1/2018 Kwon ................ G11C 16/30
2019/0252029 A1   8/2019 Lai et al.

FOREIGN PATENT DOCUMENTS

| CN | 111149169 A | 5/2020 |
| CN | 112614533 A | 4/2021 |
| CN | 113889170 A | 1/2022 |

\* cited by examiner

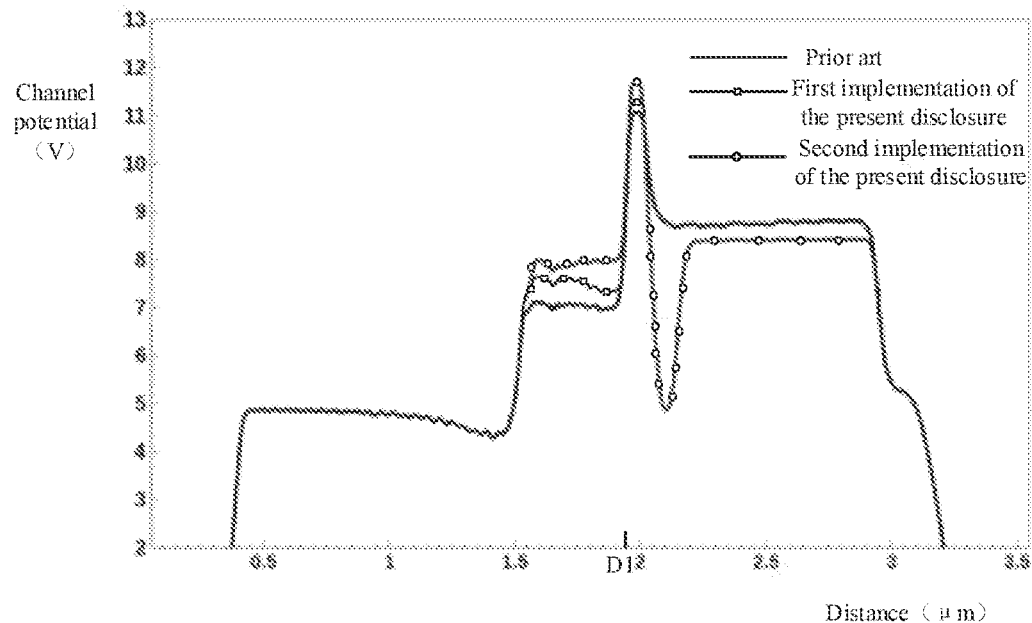

FIG. 4

| In a precharging phase, a precharging voltage is applied to a word line corresponding to a programmed memory cell of a plurality of first memory cells, and the programmed memory cell is a memory cell located between a to-be-programmed memory cell of the plurality of first memory cells and a first dummy cell | 501 |

| In a programming phase, a programming voltage is applied to a word line corresponding to the to-be-programmed memory cell | 502 |

FIG. 5

PROGRAMMING METHOD FOR SEMICONDUCTOR DEVICE AND SEMICONDUCTOR DEVICE

CROSS-REFERENCE TO RELATED APPLICATION

This application is a continuation of Interaction Application No. PCT/CN2021/126181, filed on Oct. 25, 2021, which claims the benefit of priority to Chinese Application No. 202110010729.7, filed on Jan. 6, 2021, the entire contents of which are hereby incorporated by reference in their entireties.

TECHNICAL FIELD

The present disclosure relates to the field of semiconductor technology, and in particular, to a programming method for a semiconductor device and a semiconductor device.

BACKGROUND

A memory string in a semiconductor device generally includes a memory cell and a dummy cell, and residual electrons may exist in a channel of the dummy cell. When programming a memory cell in the memory string, a programming voltage needs to be applied to a word line corresponding to the memory cell. However, a high programming voltage will attract electrons in a channel of the dummy cell, causing the memory cell to suffer programming interference.

SUMMARY

The present disclosure provides a programming method for a semiconductor device. The semiconductor device includes a memory string which includes a plurality of first memory cells and a first dummy cell stacked in sequence, and a gate of each of the first memory cells is connected to a respective word line, and a gate of the first dummy cell is connected to the first dummy word line.

The method includes as follows: in a precharging phase, a precharging voltage is applied to a word line corresponding to a programmed memory cell of the plurality of first memory cells, and the programmed memory cell is a memory cell between a to-be-programmed memory cell of the plurality of first memory cells and the first dummy cell; and in a programming phase, a programming voltage is applied to a word line corresponding to the to-be-programmed memory cell.

The present disclosure further provides a semiconductor device. The semiconductor device includes: a memory string, a plurality of word lines, a first dummy word line, and a peripheral circuit.

The memory string includes a plurality of first memory cells and a first dummy cell stacked in sequence.

A gate of each of the first memory cells is connected to a respective word line.

The first dummy word line is connected to a gate of the first dummy cell.

The peripheral circuit is connected to the plurality of word lines and the first dummy word line, and the peripheral circuit is configured to: in a programming phase, apply a first pass voltage to a word line corresponding to a first unprogrammed memory cell, wherein the first unprogrammed memory cell is an unprogrammed memory cell of the plurality of first memory cells separated from a to-be-programmed memory cell by a first preset number of first memory cells; and after applying the first pass voltage to the word line corresponding to the first unprogrammed memory cell, apply a programming voltage to the word line corresponding to the to-be-programmed memory cell.

BRIEF DESCRIPTION OF THE DRAWINGS

In order to explain the implementations or the technical solutions more clearly, the following will briefly introduce the drawings. The drawings in the following description are only some implementations of the present disclosure. Those ordinarily skilled in the art would conceive other drawings according to these drawings without creative effort.

FIG. 4 illustrates a graph of channel potential during programming in the related art and the present disclosure.

FIG. 5 illustrates a schematic flowchart of a programming method for a semiconductor device according to an implementation of the present disclosure.

DETAILED DESCRIPTION

Figure 1:
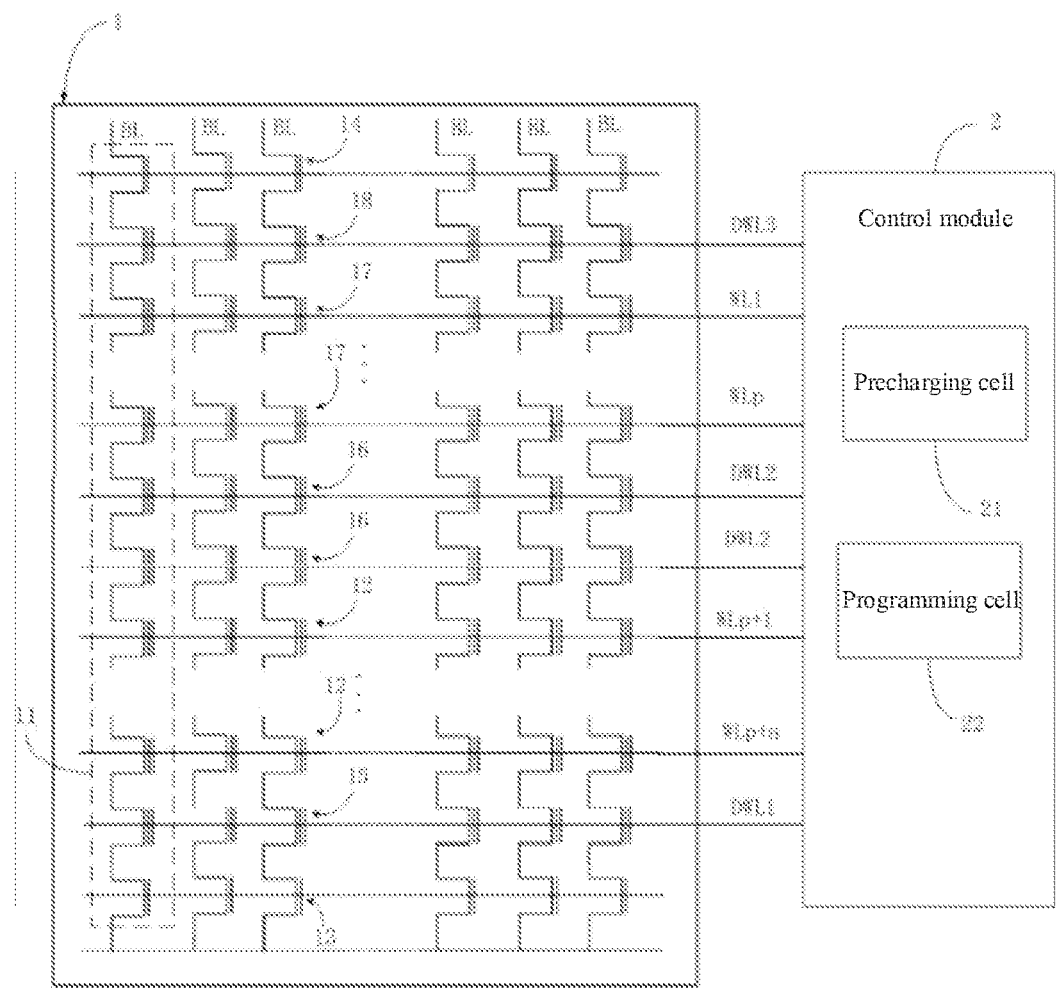
FIG. 1 illustrates a schematic diagram of a structure of a semiconductor device according to an implementation of the present disclosure.

The structures and functional details disclosed herein are only representative, and are used for the purpose of describing exemplary implementations of the present disclosure. The present disclosure may be implemented in many forms, and shall not be interpreted as being limited only to the implementations described herein.

In the description of the present disclosure, it is to be understood that the orientation or positional relationship indicated by the terms "center," "lateral," "upper," "lower," "left," "right," "vertical," "horizontal." "top," "bottom," "inner," "outer," etc. are based on the orientation or positional relationship illustrated in the drawings, and are only for the convenience of describing the present disclosure and simplifying the description, rather than indicating or implying the pointed apparatus or the element must have a specific orientation, be constructed and operated in a specific orientation, and therefore cannot be understood as a limitation of the present disclosure. In addition, the terms "first" and "second" are only used for descriptive objectives, and cannot be understood as indicating or implying relative importance or implicitly indicating the number of indicated technical features. Therefore, the features defined with "first" and "second" may explicitly or implicitly include one or more of these features. In the description of the present disclosure, unless otherwise specified, "plurality" means two or more. In addition, the term "including" and any variations thereof are intended to cover a non-exclusive inclusion.

In the description of the present disclosure, it is to be noted that, unless otherwise clearly specified and limited, the terms "installation," "be linked together," and "connection" are to be understood in a broad sense, for example, it may be a fixed connection or may be a detachable connection, or integrally connected; it may be a mechanical connection or an electrical connection; it may be directly connected or indirectly connected via an intermediate medium; and it may be the internal communication between two components. For those ordinary skilled in the art, the specific meanings of the above terms in the present disclosure may be understood under specific circumstances.

The terms used here are only for describing implementations and are not intended to limit the exemplary implementations. Unless the context clearly dictates otherwise, the singular forms "a" and "one" used herein are also intended to include the plural. It should also be understood that the terms "including" and/or "comprising" used herein specify the existence of the stated features, integers, steps, operations, cells, and/or components, and do not exclude the existence or addition of one or more other features, integers, steps, operations, cells, components, and/or combinations thereof.

The implementations of the present disclosure provide a programming method for a semiconductor device and a semiconductor device.

Referring to FIG. 1, which is a schematic diagram of a structure of a semiconductor device according to an implementation of the present disclosure. The semiconductor device includes a memory array 1 and a control module 2 electrically connected to the memory array 1. The memory array 1 may be a non-volatile memory array, which maintains its state when power is off. For example, the memory array 1 may be a NAND flash memory, a NOR flash memory, or the like.

The memory array 1 includes a plurality of longitudinally extending memory strings 11. The memory array 1 may have a single stacked structure or a dual stacked structure. When the memory array 1 has a single stacked structure, the memory string 11 may include a source selective transistor, a second dummy cell, a plurality of first memory cells, a first dummy cell, and a drain selective transistor that are sequentially stacked on the substrate. The number of the second dummy cells may be zero or at least one, and the number of the first dummy cells may be one or more than one.

The semiconductor device according to the present disclosure will be described below in detail by taking the memory array 1 having a dual stacked structure as an example.

Figure 2:
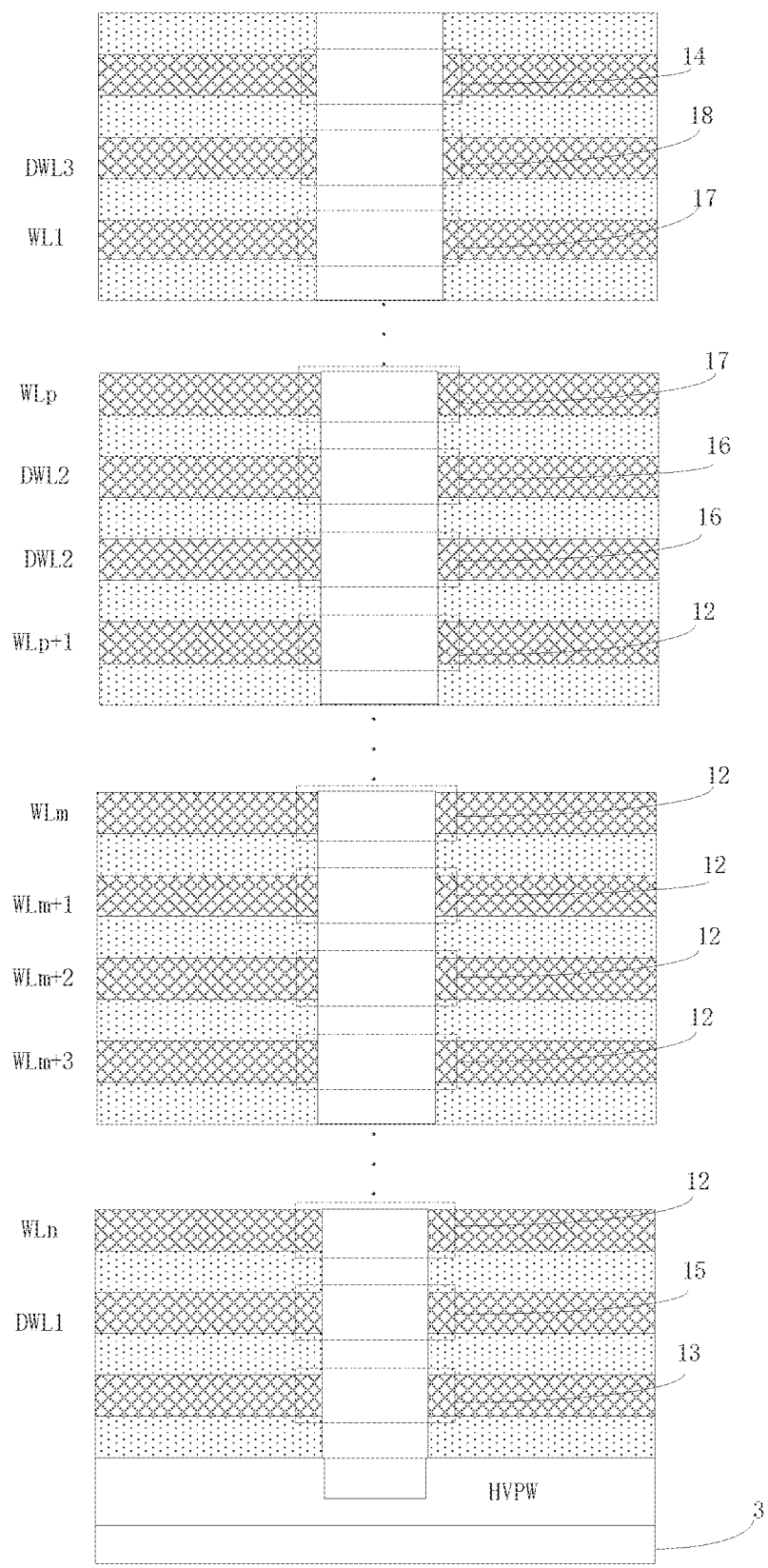
FIG. 2 illustrates a schematic diagram of a structure of a memory string in a semiconductor device according to an implementation of the present disclosure.

As illustrated in FIG. 2, in the case that the memory array 1 has a dual stacked structure, the memory string 11 may include a source selective transistor 13, a second dummy cell 15, a plurality of first memory cells 12, a first dummy cell 16, a plurality of second memory cells 17, a third dummy cell 18 and a drain selective transistor 14. The number of the second dummy cells 15 and the number of the third dummy cells 18 may be 0 or at least 1, and the number of the first dummy cells 16 may be one or more than one, which will not be specifically limited herein. One side of a substrate 3 is provided with a P-type well region HVPW. The first memory cell 12 and the second memory cell 17 may be "floating gate" type memory cells including floating gate transistors, or may be "charge trapping" type memory cells including charge trapping transistors.

The source selective transistor 13 and the drain selective transistor 14 may activate the selective memory string 11 by inputting an appropriate voltage. In some implementations, as illustrated in FIG. 1, the source selective transistor 13 of the memory strings 11 in a same memory block is connected to the ground via a same source line (for example, a common source line). The drain selective transistor 14 of each memory string 11 is connected to the corresponding bit line (BL).

Gates of the dummy cell and the memory cell are respectively connected to respective word lines. A word line connected to the second dummy cell 15 is the second dummy word line DWL1, a word line connected to the first dummy cell 16 is the first dummy word line DWL2, and a word line connected to the third dummy cell 18 is the third dummy word Line DWL3, word lines connected to a plurality of second memory cells 17 are word lines WL1, WL2, ..., WLp, respectively, and word lines connected to a plurality of first memory cells 12 are word lines WLp+1, WLp+2, ..., WLn, respectively.

A control module 2 is a peripheral circuit of the memory array 1, and the control module 2 is configured to perform read, write, erase, and verify operations on the memory array 1. The dummy cell and the memory cell are respectively electrically connected to the control module 2 via respective word lines. As illustrated in FIG. 1, the gate of the second dummy cell 15 is connected to the control module 2 via the corresponding dummy word line DWL1, the gate of the first dummy cell 16 is connected to the control module 2 via the corresponding dummy word line DWL2, and the gate of the third dummy cell 18 is connected to the control module 2 via the corresponding dummy word line DWL3, and the gates of the plurality of second memory cells 17 are respectively connected to the control module 2 via the corresponding word lines WL1, WL2, ..., WLp, and the gates of the plurality of first memory cells 12 are connected to the control module 2 via corresponding word lines WLp+1, WLp+2, ..., WLn, respectively.

In some implementations, the control module 2 includes a precharging unit 21 and a programming unit 22. The precharging unit 21 is configured to precharge the memory cells in the memory string 11 before the programming operation, and the programming unit 22 is configured to perform the programming operation on the memory cell in memory string 11. Each of the first memory cells 12, each of the second memory cells 17, the first dummy cell 16, the second dummy cell 15, and the third dummy cell 18 in the memory string 11 are electrically connected to the precharging unit 21, and each of the first memory cells 12, each of the second memory cells 17, the first dummy cell 16, the second dummy cell 15, and the third dummy cell 18 in the memory string 11 are electrically connected to the programming unit 22, respectively.

In addition, the control module 2 may also include any suitable digital signal circuits, analog signal circuits, and/or mixed signal circuits for facilitating the operation of the semiconductor device. For example, the control module 2 may also include one or more of: a data buffer (such as a bit line page buffer), a decoder (such as a row decoder or a column decoder), a sense amplifier, a charge pump, a current or voltage reference, or any active or passive components of a circuit (such as a transistor, a diode, a resistor, or a capacitor).

In the memory array 1, more and more memory cells are stacked, the storage capacity is getting larger, and the storage density is getting higher and higher, which is likely to cause serious coupling problems. A top-down programming mode is adopted to suppress the coupling problems. However, the channel of the memory cell is closed after programming. The adoption of the top-down programming mode may easily cause the channel electrons of the dummy cell above the programmed memory cell to fail to spread out, which will further result in attracting channel electrons of the dummy cell during programming the memory cell under the programmed memory cell, thereby causing programming interference.

In view of the above, the present disclosure proposes to input a precharging voltage to the programmed memory cell between the to-be-programmed memory cell and the dummy cell before programming the to-be-programmed memory cell in the memory string 11 to drift and spread the electrons in the channel of the dummy cell.

In some implementations, the precharging unit 21 inputs a precharging voltage to the word line corresponding to the programmed memory cell of the plurality of first memory cells 12 in the precharging phase, and the programmed memory cell is a memory cell located between the to-be-programmed memory cell of the plurality of first memory cells 12 and the first dummy cell 15.

Figure 3:
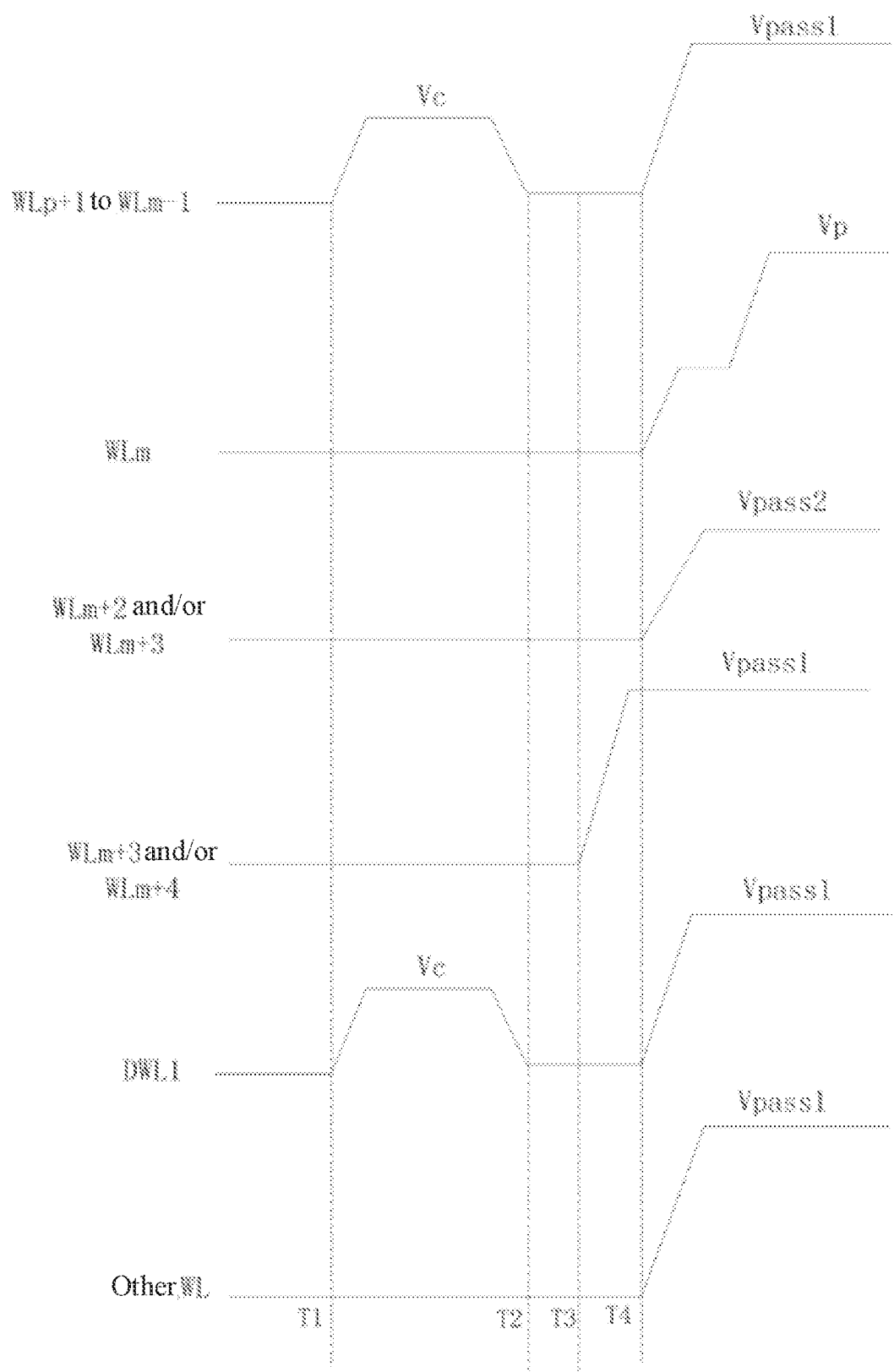
FIG. 3 illustrates a timing chart of the semiconductor device according to an implementation of the present disclosure during the programming process.

For example, referring to FIG. 2, when the $m^{th}$ memory cell of the plurality of first memory cells 12 (the $m^{th}$ memory cell is connected to the word line WLm, p+1<m≤n) is programmed by adopting a top-down programming mode, the plurality of second memory cells 17 have been programmed, the $m^{th}$ memory cell is the to-be-programmed memory cell, and the memory cells between the $m^{th}$ memory cell and the first dummy cell 16 have all been programmed, that is, the (p+1)th memory cell to the (m−1)th memory cell are programmed memory cells, the channel has been closed, and the memory cells below the $m^{th}$ memory cell are unprogrammed memory cells. In the precharging phase, as illustrated in FIG. 3, from time T1 to time T2, the precharging unit 21 is adopted to input the precharging voltage Vc to the word lines WLp+1, . . . , WLm−1 corresponding to the $(p+1)^{th}$ memory cell to the $(m-1)^{th}$ memory cell (programmed memory cell), the programmed memory cell is turned on, and the channel of the programmed memory cell is opened. The electrons in the channel of the first dummy cell 16 drift and spread out via the channel of the programmed memory cell, the channel of the to-be-programmed memory cell, the channel of the unprogrammed memory cell, and the P-type well region HVPW.

When the memory string 11 further includes the second dummy cell 15, in the precharging unit 21, the precharging voltage Vc is applied to the word lines WLp+1, . . . , WLm−1, and simultaneously the precharging voltage Vc is applied to the dummy word line DWL1 corresponding to the second dummy cell 15 to turn on the second dummy cell 15. The electrons in the channel of the first dummy cell 16 drift and spread out via the channel of the programmed memory cell, the channel of the to-be-programmed memory cell, the channel of the unprogrammed memory cell, and the channel of the second dummy cell 15 and the P-type well region HVPW.

Then, in the programming unit 22, in the programming phase, a programming voltage is applied to the word line corresponding to the to-be-programmed memory cell. For example, when the $m^{th}$ memory cell is a to-be-programmed memory cell, the programming voltage Vp is applied to the word line WLm corresponding to the $m^{th}$ memory cell in the programming phase to perform a programming operation on the $m^{th}$ memory cell. Since the electrons in the channel of the first dummy cell 16 have drifted and spread out at this time, when the to-be-programmed memory cell is programmed, no electrons in the channel of the first dummy cell 16 are attracted to the to-be-programmed cell, thereby reducing programming interference.

In order to further reduce the programming interference, in the programming phase, and before inputting the programming voltage to the word line corresponding to the to-be-programmed memory cell, in the programming unit 22, the first pass voltage is applied to the word line corresponding to the first unprogrammed memory cell, the first unprogrammed memory cell is an unprogrammed memory cell of the plurality of first memory cells separated from the to-be-programmed memory cell by a first preset number of first memory cells. In some implementations, the first preset number includes at least one of two or three, and the first pass voltage may be 9V.

For example, referring to FIG. 2, when the $m^{th}$ memory cell is the to-be-programmed memory cell, the $(m+3)^{th}$ and/or $(m+4)^{th}$ memory cell is the first unprogrammed memory cell, and the $(m+3)^{th}$ memory cell is connected to the word line WLm+3, the $(m+4)^{th}$ memory cell is connected to the word line WLm+4. In the programming phase, as illustrated in FIG. 3, at time T3, the first pass voltage Vpass1 is applied to the word line WLm+3 and/or WLm+4 corresponding to the $(m+3)^{th}$ and/or $(m+4)^{th}$ memory cell to turn on the $(m+3)^{th}$ and/or $(m+4)^{th}$ memory cell, and at this time, the other first memory cells 12 are not yet turned on, and therefore, the channel electrons around the $(m+3)^{th}$ and/or $(m+4)^{th}$ memory cell migrate to the $(m+3)^{th}$ and/or $(m+4)^{th}$ memory cell, thereby reducing the electron concentration in the channel near the to-be-programmed memory cell (the $m^{th}$ memory cell).

Then, at time T4, the programming voltage Vp is applied to the word line WLm corresponding to the $m^{th}$ memory cell to perform a programming operation on the $m^{th}$ memory cell. Since the electron concentration in the channel near the to-be-programmed memory cell (the $m^{th}$ memory cell) decreases at this time, when the to-be-programmed memory cell is programmed, fewer electrons are attracted to the to-be-programmed memory cell, thereby reducing programming interference. In addition, at least two memory cells are located between the to-be-programmed memory cell and the first unprogrammed cell to avoid attracting electrons in the channel of the to-be-programmed memory cell when the first unprogrammed cell is turned on, thereby causing a decrease in the potential of the to-be-programmed memory cell.

In addition, when inputting the programming voltage to the word line corresponding to the to-be-programmed memory cell, in the programming unit 22, the first pass voltage is further applied to the word line corresponding to the programmed memory cell, and a second pass voltage is applied to the word line corresponding to the second unprogrammed memory cell, and the second unprogrammed memory cell is an unprogrammed memory cell of the plurality of first memory cells separated from the to-be-programmed memory cell by a second preset number of first memory cells. The second pass voltage is a voltage that prevents electrons from spreading, and the second pass voltage is less than the first pass voltage. In some implementations, the second preset number includes at least one of one or two.

For example, referring to FIG. 2, when the $m^{th}$ memory cell is the to-be-programmed memory cell, the $(m+2)^{th}$ and/or $(m+3)^{th}$ memory cell is the second unprogrammed memory cell, and the $(m+2)^{th}$ memory cell is connected to the word line WLm+2, the $(m+3)^{th}$ memory cell is connected to the word line WLm+3, and the $(p+1)^{th}$ memory cell to the $(m-1)^{th}$ memory cell are programmed memory cells, which are respectively connected to the word lines WLp+1, . . . , WLm-1. In the programming phase, as illustrated in FIG. 3, at time T4, the first pass voltage Vpass1 is applied to the word lines WLp+1, . . . , WLm−1 corresponding to the $(p+1)^{th}$ to $(m-1)^{th}$ memory cells (programmed memory cells) to turn on the $(p+1)^{th}$ to $(m-1)^{th}$ memory cells, and the second pass voltage Vpass2 is applied to the word lines WLm+2 and/or WLm+3 corresponding to the $(m+2)^{th}$ and/or $(m+3)^{th}$ memory cell (the second unprogrammed memory cell) to turn on the $(m+2)^{th}$ and/or $(m+3)^{th}$ memory cell. The second pass voltage Vpass2 is less than the first pass voltage Vpass1, for example, the first pass voltage Vpass1 is 9V, and the second pass voltage Vpass2 is greater than or equal to 3V and less than 9V.

Since the pass voltage input by the $(m+2)^{th}$ and/or $(m+3)^{th}$ memory cell is smaller than the pass voltage input by other memory cells, the band gap of the channel in the $(m+2)^{th}$ and/or $(m+3)^{th}$ memory cell is large, effectively preventing the electrons in the channel under the $(m+2)^{th}$ and/or $(m+3)^{th}$ memory cell from spreading to the $m^{th}$ memory cell, which is conducive to forming a depletion region around the $m^{th}$ memory cell and improving the boosting potential of the to-be-programmed memory cell.

The $(m+3)^{th}$ memory cell cannot be the first unprogrammed memory cell and the second unprogrammed memory cell at the same time, that is, when the $(m+3)^{th}$ memory cell is the first unprogrammed memory cell, the $(m+3)^{th}$ memory cell cannot be the second unprogrammed memory cell; when the $(m+3)^{th}$ memory cell is the second unprogrammed memory cell, the $(m+3)^{th}$ memory cell is not the first unprogrammed memory cell.

In the graph illustrated in FIG. 4, the horizontal axis represents the distance to substrate 3, the vertical axis represents the channel potential, and D1 represents the channel position of the to-be-programmed memory cell. It may be seen from FIG. 4 that when adopting the programming, the channel potential of the to-be-programmed memory cell is 11V, and when adopting the first implementation according to the present disclosure (in the precharging phase, the programmed memory cells in the first memory cell 12 is precharged), the channel potential of the to-be-programmed memory cell is 11.3V, and by adopting the second implementation according to the present disclosure (in the precharging phase, the programmed memory cell in the first memory cell 12 is precharged, and in the programming phase, the first pass voltage is first applied to the first unprogrammed memory cell, and then the second pass voltage is applied to the second unprogrammed memory cell), the channel potential of the to-be-programmed memory cell is 11.7V, and therefore, the boosting potential of the to-be-programmed memory cell is effectively increased by the programming method according to the present disclosure.

In the implementations of the present disclosure, in the precharging phase, a precharging voltage is applied to the programmed memory cell between the to-be-programmed memory cell and the first dummy cell, so that the electrons in the channel of the first dummy cell drift and spread out from the bottom of the memory string to improve the programming interference problem during programming of the to-be-programmed memory cell; in the programming phase, the first pass voltage is firstly applied to the first unprogrammed memory cell that is separated from the to-be-programmed memory cell by a first preset number of memory cells, so that the channel electrons around the unprogrammed memory cell migrate to the first unprogrammed memory cell, thereby reducing the electron concentration in the channel near the to-be-programmed memory cell, and further mitigating the programming interference during programming of the to-be-programmed memory cell. In the programming phase, the second pass voltage is applied to the second unprogrammed memory cell that is separated from the to-be-programmed memory cell by a second preset number of memory cells, the second pass voltage is lower than the first pass voltage to prevent the channel electrons at the bottom of the memory string from spreading to the to-be-programmed memory cell, which is conducive to forming a depletion region around the to-be-programmed memory cell and improving the boosting potential of the to-be-programmed memory cell.

As illustrated in FIG. 5, the implementations of the present disclosure further provides a programming method for a semiconductor device. The semiconductor device includes a memory string that includes a plurality of first memory cells and a first dummy cell stacked in sequence, and the gate of each of the first memory cells is connected to a respective word line, and a gate of the first dummy cell is connected to the first dummy word line. The programming method for a semiconductor device may include steps 501 to 502 as follows.

In step 501, in a precharging phase, a precharging voltage is applied to a word line corresponding to a programmed memory cell of the plurality of first memory cells, and the programmed memory cell is a memory cell between a to-be-programmed memory cell of the plurality of first memory cells and the first dummy cell.

In step 502, in a programming phase, a programming voltage is applied to a word line corresponding to the to-be-programmed memory cell.

In some implementations, the method further includes as follows.

In the programming phase, before the programming voltage is applied to the word line corresponding to the to-be-programmed memory cell, the first pass voltage is input to the word line corresponding to the first unprogrammed memory cell, and the first unprogrammed memory cell is an unprogrammed memory cell of the plurality of first memory cells separated from the to-be-programmed memory cell by a first preset number of memory cells.

In some implementations, the method further includes as follows.

When a programming voltage is input to the word line corresponding to the to-be-programmed memory cell, a first pass voltage is input to the word line corresponding to the programmed memory cell, and a second pass voltage is input to the word line corresponding to the second unprogrammed memory cell, the second pass voltage is less than the first pass voltage and is configured to prevent electrons from spreading to the to-be-programmed memory cell, and the second unprogrammed memory cell is an unprogrammed memory cell of the plurality of first memory cells separated from the to-be-programmed memory cell by a second preset number of memory cells.

In some implementations, the first preset number includes at least one of two or three.

In some implementations, the second preset number includes at least one of one or two.

In some implementations, the memory string further includes a second dummy cell located on a side of the plurality of first memory cells away from the first dummy cell, the gate of the second dummy cell is connected to the second dummy word line.

The method further includes as follows.

In the precharging phase, the precharging voltage is input to the second dummy word line corresponding to the second dummy cell.

When a programming voltage is input to the word line corresponding to the to-be-programmed memory cell, the first pass voltage is input to the first dummy word line corresponding to the first dummy cell and the second dummy word line corresponding to the second dummy cell.

In some implementations, the memory string further includes a plurality of second memory cells stacked on the first dummy cell, and the plurality of second memory cells are programmed memory cells.

It can be seen from the above that, in the implementations of the present disclosure, in the precharging phase, a precharging voltage is input to the programmed memory cell between the to-be-programmed memory cell and the first dummy cell, so that the electrons in the channel of the first dummy cell drift and spread out from the bottom of the memory string to mitigate the programming interference during programming of the to-be-programmed memory cell; in the programming phase, the first pass voltage is firstly input to the first unprogrammed memory cell that is separated from the to-be-programmed memory cell by a first preset number of memory cells, so that the channel electrons around the unprogrammed memory cell migrate to the first unprogrammed memory cell, thereby reducing the electron concentration in the channel near the to-be-programmed memory cell, and further mitigating the programming interference during programming of the to-be-programmed memory cell; in the programming phase, the second pass voltage is input to the second unprogrammed memory cell that is separated from the to-be-programmed memory cell by a second preset number, the second pass voltage is lower than the first pass voltage to prevent the channel electrons at the bottom of the memory string from spreading to the memory cell to programmed, which is conducive to forming a depletion region around the to-be-programmed memory cell and improving the boosting potential of the to-be-programmed memory cell.

The present disclosure has been disclosed by using exemplary implementations. These exemplary implementations are not intended to limit the present disclosure. Those ordinarily skilled in the art may make various changes and modifications without departing from the spirit and scope of the present disclosure, and therefore, the protection scope of the present disclosure shall be subject to the scope defined by the claims.

The invention claimed is:

1. A programming method for a semiconductor device, wherein the semiconductor device comprises a memory string comprising a plurality of first memory cells and a first dummy cell stacked in sequence, wherein a gate of each first memory cell is connected with a respective word line, and a gate of the first dummy cell is connected with a first dummy word line, the first dummy cell is a memory cell that is programmed not for data storage, the programming method comprises:
in a programming phase, applying a first pass voltage to a word line corresponding to a first unprogrammed memory cell, wherein the first unprogrammed memory cell is an unprogrammed memory cell of the plurality of first memory cells separated from a to-be-programmed memory cell by a first preset number of first memory cells, the first pass voltage being applied to another word line, corresponding to a second unprogrammed memory cell of the plurality of first memory cells, next to the to-be-programmed memory cell; and
after applying the first pass voltage to the word line corresponding to the first unprogrammed memory cell, applying a programming voltage to a word line corresponding to the to-be-programmed memory cell.

2. The programming method of claim 1, wherein the first preset number is two or three.

3. The programming method of claim 1, further comprising:
when applying the programming voltage to the word line corresponding to the to-be-programmed memory cell, applying the first pass voltage to a word line corresponding to a programmed memory cell and applying a second pass voltage to a word line corresponding to a third unprogrammed memory cell, wherein the second pass voltage is less than the first pass voltage, the programmed memory cell is a memory cell between the to-be-programed memory cell of the plurality of first memory cells and the first dummy cell, and the third unprogrammed memory cell is an unprogrammed memory cell of the plurality of first memory cells separated from the to-be-programmed memory cell by a second preset number of first memory cells.

4. The programming method of claim 3, wherein:
when the first preset number is two, the second preset number is one; and
when the first preset number is three, the second preset number is two.

5. The programming method of claim 1, wherein the memory string further comprises a second dummy cell located on a side of the plurality of first memory cells away from the first dummy cell, a gate of the second dummy cell is connected to a second dummy word line,
the programming method further comprises:
when applying the programming voltage to the word line corresponding to the to-be-programmed memory cell, applying the first pass voltage to the first dummy word line corresponding to the first dummy cell and the second dummy word line corresponding to the second dummy cell.

6. The programming method of claim 1, wherein the memory string further comprises a plurality of second memory cells stacked on the first dummy cell, and the plurality of second memory cells are programmed memory cells.

7. The programming method of claim 1, wherein:
in the programming phase, applying the first pass voltage to the word line corresponding to the first unprogrammed memory cell comprises applying the first pass voltage to the word line corresponding to the first unprogrammed memory cell when remaining first memory cells, other than the first unprogrammed memory cell, of the plurality of first memory cells are turned off.

8. The programming method of claim 1, further comprising:
in the programming phase, applying the first pass voltage to a word line corresponding to a programmed memory cell adjacent to the to-be-programmed memory cell.

9. A programming method for a semiconductor device, wherein the semiconductor device comprises a memory string comprising a plurality of first memory cells and a first dummy cell stacked in sequence, wherein a gate of each first memory cell is connected to a respective word line, and a gate of the first dummy cell is connected to a first dummy word line, the first dummy cell being a memory cell that is programmed not for data storage,
the programming method comprises:
in a programming phase, applying a programming voltage to a word line corresponding to a to-be-programmed memory cell of the plurality of first memory cells, while applying a first pass voltage to a word line corresponding to a programmed memory cell and applying a second pass voltage to a word line corresponding to a second unprogrammed memory cell, the first pass voltage being applied to another word line, corresponding to a second unprogrammed memory cell of the plurality of first memory cells, next to the to-be-programmed memory cell, wherein:

the second pass voltage is less than the first pass voltage, the programmed memory cell is a memory cell between the to-be-programmed memory cell of the plurality of first memory cells and the first dummy cell, and the second unprogrammed memory cell is an unprogrammed memory cell of the plurality of first memory cells separated from the to-be-programmed memory cell by a second preset number of first memory cells.

10. The programming method of claim 9, wherein the second preset number is one or two.

11. The programming method of claim 9, wherein the memory string further comprises a second dummy cell located on a side of the plurality of first memory cells away from the first dummy cell, a gate of the second dummy cell is connected to a second dummy word line, the programming method further comprises:

when applying the programming voltage to a word line corresponding to the to-be-programmed memory cell, applying a first pass voltage to the first dummy word line corresponding to the first dummy cell and the second dummy word line corresponding to the second dummy cell.

12. The programming method of claim 9, wherein the memory string further comprises a plurality of second memory cells stacked on the first dummy cell, and the plurality of second memory cells are programmed memory cells.

13. A semiconductor device, comprising:

a memory string, comprising a plurality of first memory cells and a first dummy cell stacked in sequence, the first dummy cell being a memory cell that is programmed not for data storage;

a plurality of word lines, a gate of each first memory cell being connected to a respective word line;

a first dummy word line, connected to a gate of the first dummy cell; and a peripheral circuit, connected to the plurality of word lines and the first dummy word line and configured to:

in a programming phase, apply a first pass voltage to a word line corresponding to a first unprogrammed memory cell, wherein the first unprogrammed memory cell is an unprogrammed memory cell of the plurality of first memory cells separated from a to-be-programmed memory cell by a first preset number of first memory cells, the first pass voltage being applied to another word line, corresponding to a second unprogrammed memory cell of the plurality of first memory cells, next to the to-be-programmed memory cell; and after applying the first pass voltage to the word line corresponding to the first unprogrammed memory cell, apply a programming voltage to a word line corresponding to the to-be-programmed memory cell.

14. The semiconductor device of claim 13, wherein the first preset number is two or three.

15. The semiconductor device of claim 13, wherein the peripheral circuit is further configured to:

when applying the programming voltage to the word line corresponding to the to-be-programmed memory cell, apply the first pass voltage to a word line corresponding to a programmed memory cell and apply a second pass voltage to a word line corresponding to a third unprogrammed memory cell, wherein the second pass voltage is less than the first pass voltage, the programmed memory cell is a memory cell between the to-be-programmed memory cell of the plurality of first memory cells and the first dummy cell, and the third unprogrammed memory cell is an unprogrammed memory cell of the plurality of first memory cells separated from the to-be-programmed memory cell by a second preset number of first memory cells.

16. The semiconductor device of claim 15, wherein the second preset number is one or two.

17. The semiconductor device of claim 13, wherein the memory string further comprises a second dummy cell located on a side of the plurality of first memory cells away from the first dummy cell, a gate of the second dummy cell is connected to a second dummy word line, the peripheral circuit is further configured to: when applying the programming voltage to the word line corresponding to the to-be-programmed memory cell, apply the first pass voltage to the first dummy word line corresponding to the first dummy cell and the second dummy word line corresponding to the second dummy cell.

18. The semiconductor device of claim 13, wherein the memory string further comprises a plurality of second memory cells stacked on the first dummy cell, and the plurality of second memory cells are programmed memory cells.

19. The semiconductor device of claim 13, wherein:

the peripheral circuit is further configured to, in the programming phase, applying the first pass voltage to the word line corresponding to the first unprogrammed memory cell when remaining first memory cells, other than the first unprogrammed memory cell, of the plurality of first memory cells are turned off.

20. The semiconductor device claim 13, wherein:

the peripheral circuit is further configured to, in the programming phase, applying the first pass voltage to a word line corresponding to a programmed memory cell adjacent to the to-be-programmed memory cell.

\* \* \* \* \*